(12) United States Patent
Ye et al.

(10) Patent No.: US 11,804,833 B1
(45) Date of Patent: Oct. 31, 2023

(54) GATE LEAKAGE CURRENT MONITOR APPARATUS AND CONTROL METHOD

(71) Applicant: InventChip Technology Co., Ltd., Shanghai (CN)

(72) Inventors: Zhong Ye, Plano, TX (US); Danyang Zhu, Cary, NC (US)

(73) Assignee: InventChip Technology Co., Ltd., Shanghai (CN)

( * ) Notice: Subject to any disclaimer, the term of this patent is extended or adjusted under 35 U.S.C. 154(b) by 0 days.

(21) Appl. No.: 17/809,344

(22) Filed: Jun. 28, 2022

(51) Int. Cl.
*H03K 17/16* (2006.01)
*G01R 31/52* (2020.01)
*G01R 19/165* (2006.01)
*G06F 1/26* (2006.01)

(52) U.S. Cl.
CPC ..... *H03K 17/161* (2013.01); *G01R 19/16576* (2013.01); *G01R 31/52* (2020.01); *G06F 1/26* (2013.01)

(58) Field of Classification Search
CPC .. H03K 5/22; H03K 5/24; H03K 5/26; H03K 17/08; H03K 17/082; H03K 17/0822; H03K 17/0828; H03K 17/16; H03K 17/161; H03K 17/165; H03K 2217/9605; G01R 19/16566; G01R 19/16576; G01R 31/32; G06F 1/26
See application file for complete search history.

(56) References Cited

U.S. PATENT DOCUMENTS

| | | | |
|---|---|---|---|
| 11,165,423 B2 * | 11/2021 | Ye | H03K 17/08122 |
| 11,611,339 B2 * | 3/2023 | Ye | H03K 17/08122 |
| 2022/0416783 A1 * | 12/2022 | Hou | H02M 1/08 |

* cited by examiner

*Primary Examiner* — Long Nguyen
(74) *Attorney, Agent, or Firm* — AP3 Law Firm PLLC

(57) ABSTRACT

An apparatus includes a capacitor coupled to a power switch, wherein the capacitor is configured to provide a negative gate voltage to the power switch when a turn-off signal is applied to a gate of the power switch, and a sink and source power supply coupled to the capacitor, wherein the sink and source power supply has a first current limit for controlling a sink current flowing from the capacitor to the sink and source power supply, and a second current limit for controlling a source current flowing from the sink and source power supply to the capacitor.

20 Claims, 6 Drawing Sheets

GATE LEAKAGE CURRENT MONITOR APPARATUS AND CONTROL METHOD

TECHNICAL FIELD

The present invention relates to a gate oxide aging monitor apparatus and control method, and, in particular embodiments, to a monitor apparatus for detecting gate leakage current in a power switch.

BACKGROUND

As technologies evolve, power switches have been widely used in power conversion applications such as electric vehicle traction inverters. A typical power converter or inverter may include a plurality of power switches or dies. The power switches and dies may be implemented as Metal-oxide-semiconductor (MOS) field-effect transistors (FETs) (MOSFETs), Insulated gate bipolar transistors (IGBTs), any combinations thereof and the like. The MOSFETs can be further divided into two categories. The silicon based power MOSFETs have been widely used in low voltage, low power and high frequency applications. The silicon carbide (SiC) based power MOSFETs are widely used in high voltage, high frequency and high power density applications.

Each power switch described above has a dielectric layer (e.g., an oxide layer) placed between a gate terminal and a semiconductor surface of the power switch. The oxide layer may be formed of suitable dielectric materials such as silicon dioxide ($SiO_2$) and the like. Over time, the oxide layer may degrade. The degradation of the oxide layer is caused by gate voltage stresses, and/or thermal and mechanical stresses. The voltage stress results in charge accumulation inside the oxide layer, which gradually forms a current path in weak locations and leads to an increasing leakage current. The thermal and mechanical stress can cause the oxide layer cracking, which leads to an increasing leakage current as well.

As the semiconductor manufacturing technology further shrinks transistor dimensions and reduces the gate drive voltage, the thickness of the gate oxide layer also decreases. Such a reduced gate dimension and thickness makes the reliability of the switch device more sensitive to the manufacturing process and material quality. Around 62% of the power device failure is related to the aging of the gate oxide layer. Premature aging and defects can raise a serious safety problem in some applications such as electric vehicles. Monitoring the health of the power switch is an effective way to provide a warning so as to prevent fatal incidents.

In order to monitor the gate oxide aging process, a variety of electrical parameters may be utilized as precursors. The most important precursor indicating the aging and degradation of the gate oxide layer is the gate leakage current of a power switch. When the gate leakage current occurs, it flows from the gate to the source of the power switch in response to a positive or averaged positive voltage applied to the gate. The gate leakage current starts with a very small value (e.g., a few nA), and then gradually increases to several microamperes (uA). In the worst case, the gate leakage current may be up to a few milliamps (mA). As long as the gate driver coupled to the power switch can provide an adequate gate drive voltage, the power switch can still operate normally, but the power switch is not far away from device malfunction such as gate short-circuiting. In many applications with high safety requirements, such as electrical vehicles, it is critical to issue a warning signal before the electrical vehicles suddenly stop operating. It is imperative to have a reliably gate oxide ageing and degradation monitoring circuit.

The conventional gate leakage current detection method is based on measuring the current flowing through the gate resistor. Since the gate resistor is in the range of a few Ohms, a leakage current having a few microamperes can only generate a voltage in microvolts across the gate resistor. Furthermore, the current flowing through the gate resistor is very noisy and the PWM duty cycle keeps changing it. As a result, the conventional gate leakage current detection method is not accurate and reliable. It would be desirable to have a simple apparatus to detect the gate leakage current. The present disclosure addresses this need.

SUMMARY

These and other problems are generally solved or circumvented, and technical advantages are generally achieved, by preferred embodiments of the present disclosure which provide a monitor apparatus for detecting gate leakage current in a power switch.

In accordance with an embodiment, an apparatus comprises a capacitor coupled to a power switch, wherein the capacitor is configured to provide a negative gate voltage to the power switch when a turn-off signal is applied to a gate of the power switch, and a sink and source power supply coupled to the capacitor, wherein the sink and source power supply has a first current limit for controlling a sink current flowing from the capacitor to the sink and source power supply, and a second current limit for controlling a source current flowing from the sink and source power supply to the capacitor.

In accordance with another embodiment, a method comprises providing a sink current having a first current limit and a source current having a second current limit to a capacitor coupled to a power switch, wherein the capacitor is configured to provide a negative gate voltage to the power switch when a turn-off signal is applied to a gate of the power switch, detecting a voltage across the capacitor and sending a warning signal after the voltage across the capacitor exceeds a first predetermined voltage, and clamping the voltage across the capacitor to a second predetermined voltage higher than the first predetermined voltage.

In accordance with yet another embodiment, a system comprises a capacitor coupled to a power switch, and a semiconductor chip comprising a sink and source power supply, a gate leakage detection circuit and a voltage clamping circuit, wherein the sink and source power supply has a first current limit for controlling a sink current flowing from the capacitor to the sink and source power supply, and a second current limit for controlling a source current flowing from the sink and source power supply to the capacitor, and the gate leakage detection circuit comprises a comparator having an inverting input configured to receive a first reference, a non-inverting input connected to a common node of the capacitor and the power switch, and an output configured to generate a warning signal.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a monitor apparatus for detecting gate leakage current in a power switch. The disclosure may also be applied, however, to detecting leakage currents in a variety of switching elements in power conversion systems. Hereinafter, various embodiments will be explained in detail with reference to the accompanying drawings.

Figure 1:
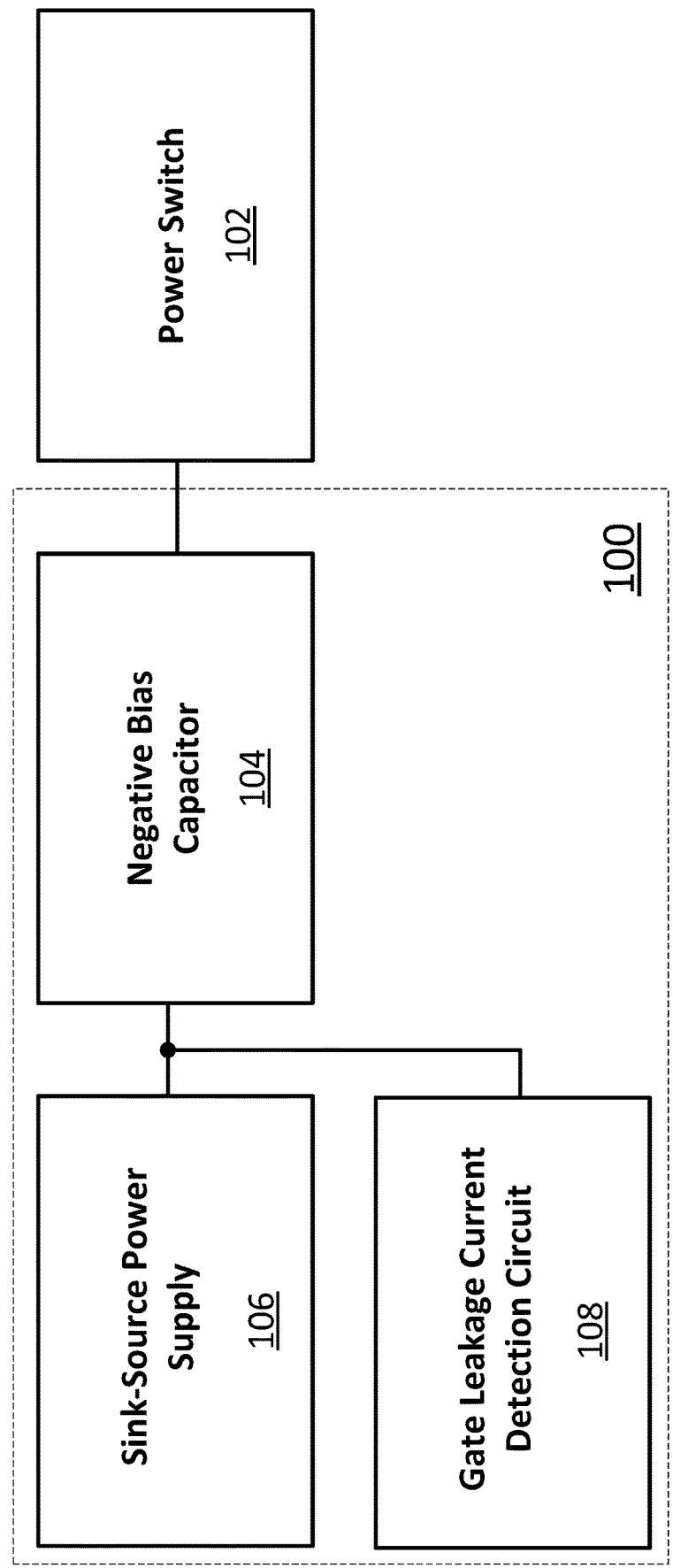
FIG. 1 illustrates a block diagram of a system including a power switch and a gate aging monitor apparatus in accordance with various embodiments of the present disclosure.

FIG. 1 illustrates a block diagram of a system including a power switch and a gate aging monitor apparatus in accordance with various embodiments of the present disclosure. The system may be a power conversion system such as an alternating current-direct current (AC/DC) power conversion system, a direct current-direct current (DC/DC) power conversion system, a direct current-alternating direct current (DC/AC) power conversion system, any combinations thereof and the like. For simplicity, only one power switch (e.g., power switch 102) is illustrated in FIG. 1. A person skilled in the art would understand this power switch is electrically connected to other function units (not shown in FIG. 1) of the system.

The gate aging monitor apparatus 100 is connected to the power switch 102. The gate aging monitor apparatus 100 comprises a negative bias capacitor 104, a sink and source power supply 106 and a gate leakage current detection circuit 108.

Figure 2:
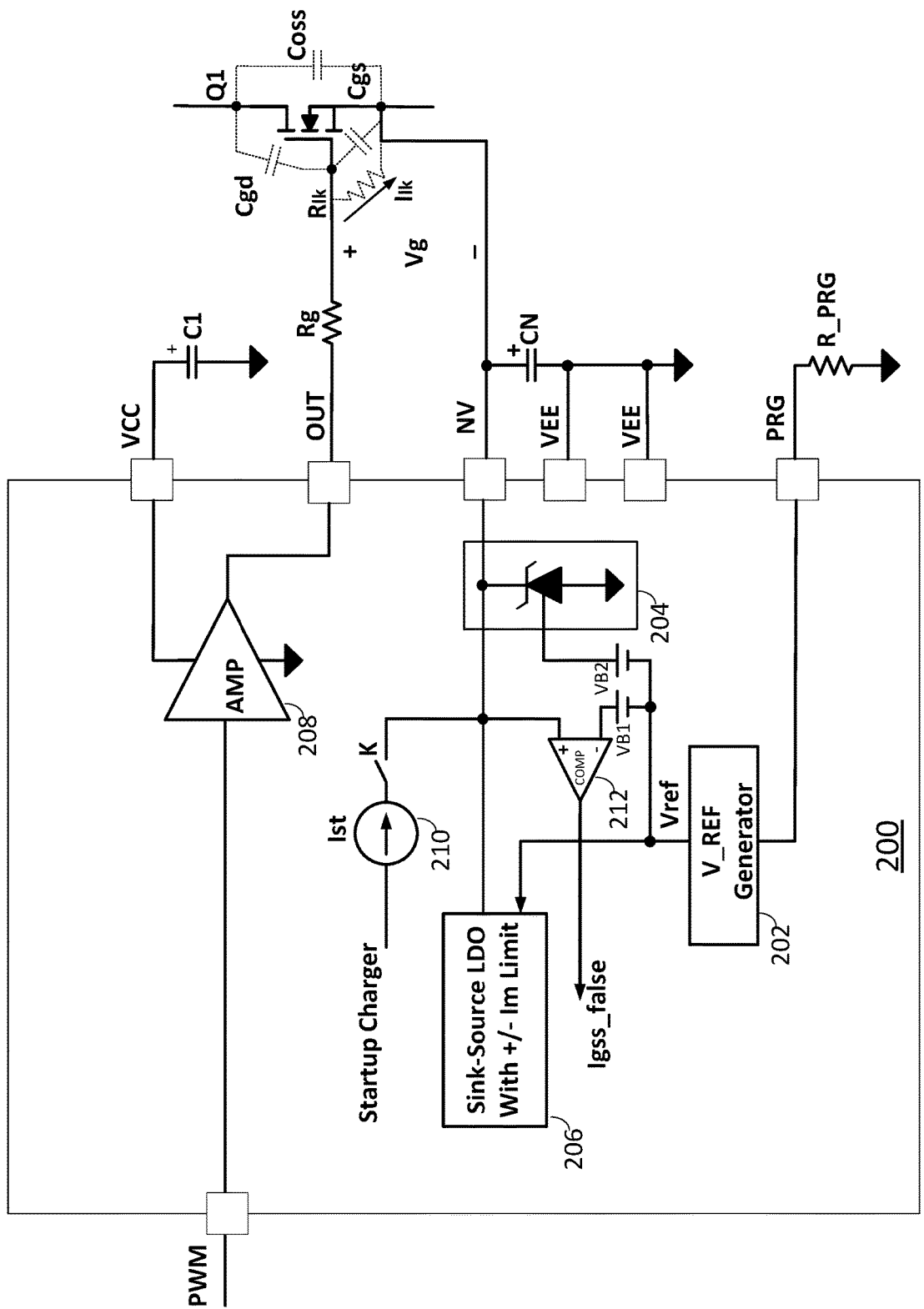
FIG. 2 illustrates a schematic diagram of a first implementation of the gate aging monitor apparatus shown in FIG. 1 in accordance with various embodiments of the present disclosure.

In some embodiments, the sink and source power supply 106 and the gate leakage current detection circuit 108 are placed in a semiconductor chip (not shown but illustrated in FIG. 2). The negative bias capacitor 104 is placed outside the semiconductor chip. In alternative embodiments, the negative bias capacitor 104, the sink and source power supply 106 and the gate leakage current detection circuit 108 may be integrated on a same semiconductor chip.

As shown in FIG. 1, the negative bias capacitor 104 is coupled to the power switch 102. In operation, the negative bias capacitor 104 is configured to provide a negative gate voltage to the power switch 102 when a turn-off signal is applied to the gate of the power switch 102. In some embodiments, the negative bias capacitor 104 is coupled between a source of the power switch 102 and a ground terminal. The detailed structure and operating principle of this configuration will be described below with respect to FIG. 2. In alternative embodiments, the negative bias capacitor 104 is coupled between an output of a gate driver and the gate of the power switch 102. The detailed structure and operating principle of this configuration will be described below with respect to FIG. 5.

In some embodiments, the sink and source power supply 106 is implemented as a low dropout (LDO) regulator. The sink and source power supply 106 has an output connected to a positive terminal of the negative bias capacitor 104. In normal operation, the sink and source power supply 106 is configured to regulate a voltage across the negative bias capacitor 104 according to a predetermined reference. In particular, when the voltage across the negative bias capacitor 104 is greater than the predetermined reference, the negative bias capacitor 104 is discharged by a sink current flowing from the negative bias capacitor 104 to the sink and source power supply 106. On the other hand, when the voltage across the negative bias capacitor 104 is less than the predetermined reference, the negative bias capacitor 104 is charged by a source current flowing from the sink and source power supply 106 to the negative bias capacitor 104. Furthermore, the sink and source power supply 106 is employed to detect the gate leakage current of the power switch 102.

The sink and source power supply 106 has a first current limit and a second current limit. The first current limit is used for controlling the sink current flowing from the negative bias capacitor 104 to the sink and source power supply 106. The second current limit is used for controlling the source current flowing from the sink and source power supply 106 to the negative bias capacitor 104. When the gate leakage current of the power switch 102 is greater than the first current limit for controlling the sink current flowing from the negative bias capacitor 104 to the sink and source power supply 106, the voltage across the negative bias capacitor 104 cannot be regulated by the sink and source power supply 106. The voltage across the negative bias capacitor 104 is charged up to a higher level by the gate leakage current. The gate leakage current detection circuit 108 is capable of detecting this voltage change, and generating a warning signal.

In some embodiments, the gate leakage current detection circuit 108 comprises a comparator having an inverting input configured to receive a first reference, a non-inverting input connected to a common node of the negative bias capacitor 104 and the power switch 102, and an output configured to generate a warning signal. The detailed structure and operating principle of the gate leakage current detection circuit 108 will be described below with respect to FIG. 2.

In some embodiments, the power switch 102 is a metal-oxide-semiconductor field-effect transistor (MOSFET). Alternatively, the power switch 102 may be implemented as any suitable semiconductor devices such as bipolar junction transistor (BJT) devices, super junction transistor (SJT) devices, insulated gate bipolar transistor (IGBT) devices, gallium nitride (GaN) based power devices, silicon carbide (SiC) based power devices, any combinations thereof and/or the like.

In some embodiments, the power switch 102 has a metal oxide gate. In operation, a negative gate drive voltage may be employed to maintain a reliable turn-off of the power switch 102. The negative bias capacitor 104 is employed to insert a voltage source between the source of the power switch 102 and the ground terminal of the gate drive circuit. As a result, the negative bias capacitor 104 provides a negative gate voltage to the power switch 102 when a turn-off signal is applied to the gate of the power switch 102. The capacitance of the negative bias capacitor 104 is much greater than the gate capacitance of the power switch 102, and the charge to turn on the power switch 102 is equal to the charge removed from the power switch 102, the voltage across the negative bias capacitor 104 is maintained at a predetermined voltage level (a pre-charged value determined during a startup process) with a negligible ripple.

In operation, if a small gate leakage current occurs, the sink and source power supply 106 is able to compensate the gate leakage current, and maintain the voltage across at the negative bias capacitor 104 at the predetermined voltage level. However, if the gate leakage current exceeds the maximum current limit of the sink and source power supply 106, the voltage across at the negative bias capacitor 104 starts to rise. When the voltage across at the negative bias capacitor 104 reaches a first predetermined voltage level (e.g., (Vref+VB1) shown in FIG. 2), a warning signal is issued. Furthermore, the voltage across at the negative bias capacitor 104 is clamped at a second predetermined voltage level (e.g., (Vref+VB2) shown in FIG. 2) to prevent the negative voltage from running away. It should be noted that the maximum current limit of the sink and source power supply 106 is the threshold of the average gate oxide leakage current allowed.

FIG. 2 illustrates a schematic diagram of a first implementation of the gate aging monitor apparatus shown in FIG. 1 in accordance with various embodiments of the present disclosure. The power switch 102 is implemented as a MOSFET Q1. As shown in FIG. 2, there may be three parasitic capacitors. A first parasitic capacitor Cgd is connected between the drain and the gate of Q1. A second parasitic capacitor Cgs is connected between the gate and the source of Q1. A third parasitic capacitor Coss is connected between the drain and the source of Q1.

In operation, the oxide layer underneath the gate of Q1 may degrade. This degradation of the oxide layer causes a leakage current path from the gate to the source of Q1. The resistor Rlk shown in FIG. 2 is used to represent the equivalent resistance of this leakage current path. Ilk is used to represent the leakage current flowing from the gate to the source of Q1.

As described above with respect to FIG. 1, the gate aging monitor apparatus comprises the negative bias capacitor 104, the sink and source power supply 106 and the gate leakage current detection circuit 108. In the first implementation, the negative bias capacitor 104 is implemented as a capacitor CN connected between the source of Q1 and ground. The sink and source power supply 106 is implemented as a sink and source LDO 206. The gate leakage current detection circuit 108 is implemented as a comparator 212.

As shown in FIG. 2, the sink and source LDO 206 and the comparator 212 are integrated in a semiconductor chip 200. The capacitor CN is placed outside the semiconductor chip 200. The semiconductor chip 200 comprises a plurality of input/output terminals such as VCC, OUT, NV, VEE, PRG and PWM.

As shown in FIG. 2, a capacitor C1 is connected between VCC and ground. VCC is connected to a bias power source of the semiconductor chip 200. OUT is configured to generate a gate drive signal fed into the gate of Q1. NV is connected to a positive terminal of CN. In the configuration shown in FIG. 2, the voltage on the terminal NV is equal to the voltage across the capacitor CN. VEE is connected to ground. VEE is alternatively referred to as a ground terminal. PRG is connected to an external resistor R_PRG. R_PRG is employed to adjust the value of an internal reference (Vref) of the semiconductor chip 200. PWM is an input terminal for receiving a PWM signal.

The semiconductor chip 200 further comprises a gate driver 208, a startup charger, a voltage clamping circuit 204 and a reference generator 202. As shown in FIG. 2, the startup charger comprises a current source 210 and a switch K connected in series.

In normal operation, a PWM signal is fed into the gate driver 208. The gate driver 208 is a power amplifier that accepts a low-power input (e.g., the PWM signal) from a controller IC (not shown) and produces a high-current drive input for the gate of the power switch Q1. As shown in FIG. 2, an amplified gate drive signal generated by the gate driver 208 is applied to the gate of Q1 through a gate drive resistor Rg.

The startup charger is used to charge the capacitor CN when the gate drive circuit is started. When the gate drive circuit is started or restarted, the switch K is turned on. The current source 210 of the startup charger is able to quickly charge the capacitor CN to a predetermined voltage level.

The sink and source LDO 206 is configured to receive a reference signal Vref generated by the reference generator 202. Based on the reference signal Vref, the sink and source LDO 206 is able to regulate the voltage across the capacitor CN through applying either a sink current or a source current to the capacitor CN. Once the gate leakage current exceeds the sink current limit of the sink and source LDO 206, the voltage across the capacitor CN is out of regulation. In particular, the voltage across the capacitor CN is charged to a higher voltage level by the gate leakage current. The comparator 212 is capable of detecting the higher voltage across the capacitor CN and generating a warning signal.

As shown in FIG. 2, the comparator 212 has an inverting input configured to receive a first reference equal to the sum of Vref and VB1 (Vref+VB1), a non-inverting input connected to a common node of the capacitor CN and the power switch Q1, and an output configured to generate a warning signal Igss_false. In operation, once the voltage across the capacitor CN is greater than the sum of Vref and VB1, the comparator 212 generates the warning signal Igss_false. It should be noted that VB1 is a predetermined reference. Depending on design needs, VB1 may vary accordingly.

The voltage clamping circuit 204 is implemented as a Zener diode connected in parallel with the capacitor CN. As shown in FIG. 2, the cathode of the Zener diode is connected to the positive terminal of the capacitor CN. The anode of the Zener diode is connected to the negative terminal of the capacitor CN. In operation, the Zener diode is configured such that a voltage across the capacitor CN is clamped at a voltage level equal to a second reference equal to the sum of Vref and VB2 (Vref+VB2). It should be noted that VB2 is a predetermined reference higher than VB1.

It should further be noted that the voltage clamping circuit 204 shown in FIG. 2 is merely an example. Depending on different applications and design needs, the voltage clamping circuit can be any Zener diode equivalent circuitry such as a shunt regulator or other suitable clamping circuitry.

One advantageous feature of having the gate leakage current detection circuit shown in FIG. 2 is that the circuit is not sensitive to switching noise. The voltage across the capacitor CN is able to indicate whether a large leakage current occurs in the power switch Q1. Once the leakage current exceeds a predetermined level, the circuit can issue an alarm (e.g., a warning signal shown in FIG. 2).

Figure 3:
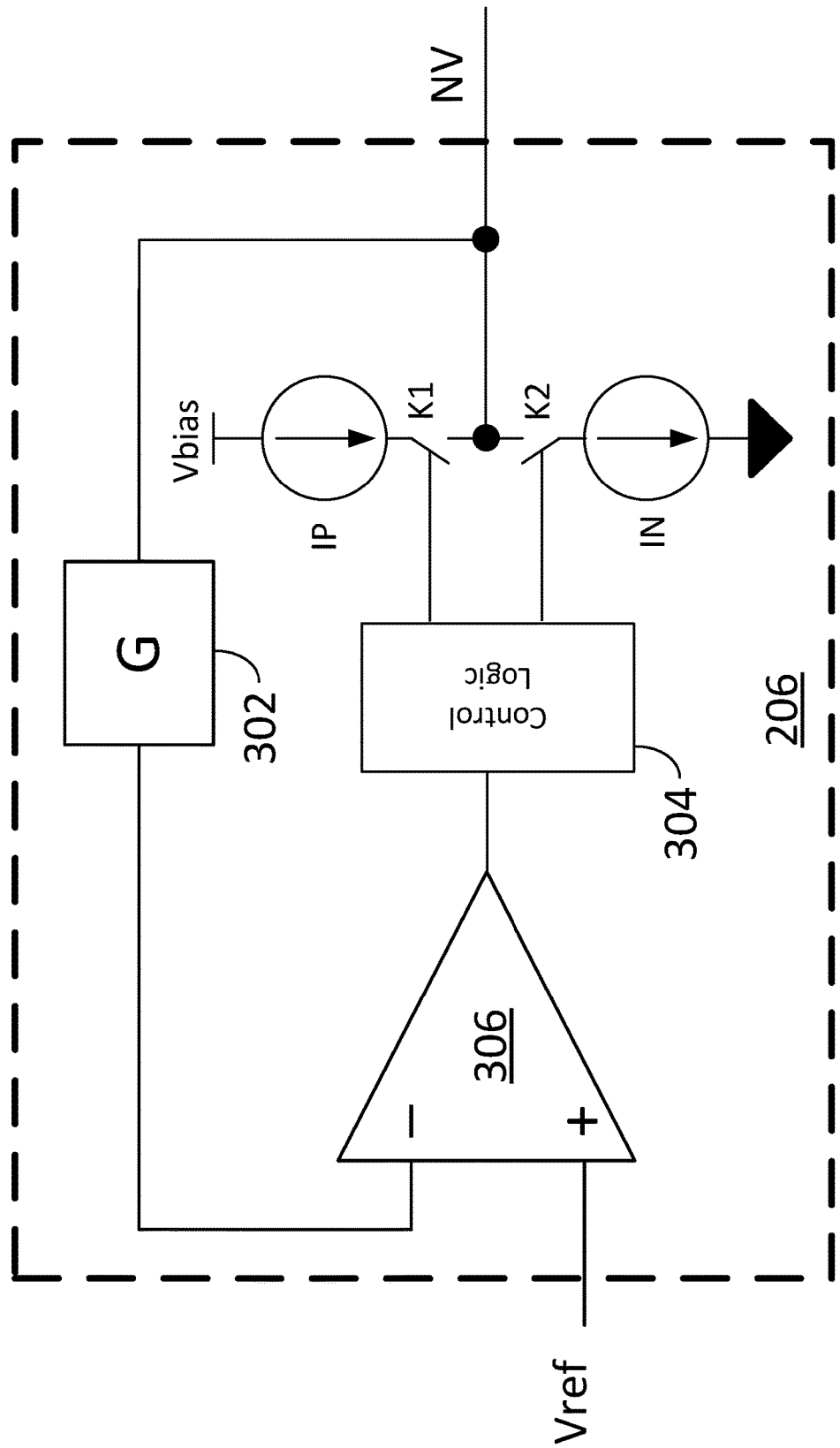
FIG. 3 illustrates a schematic diagram of the sink and source LDO shown in FIG. 2 in accordance with various embodiments of the present disclosure.

FIG. 3 illustrates a schematic diagram of the sink and source LDO shown in FIG. 2 in accordance with various embodiments of the present disclosure. As shown in FIG. 3, the sink and source LDO 206 comprises a first current source IP, a first switch K1, a second switch K2, a second current source IN, an amplifier 306, a feedback network 302 and a control logic unit 304.

As shown in FIG. 3, the first current source IP, the first switch K1, the second switch K2 and the second current source IN are connected in series between a bias voltage Vbias and ground. A common node of the first switch K1 and the second switch K2 is connected to the capacitor CN through the input/output terminal NV. In some embodiments, the first current source IP is of a first maximum current limit for controlling the source current of the sink and source LDO 206. The second current source IN is of a second maximum current limit for controlling the sink current of the sink and source LDO 206. In some embodiments, the first maximum current limit is approximately equal to 100 microamperes. The second maximum current limit is approximately equal to 100 microamperes.

The amplifier 306 has a non-inverting input configured to receive the predetermined reference Vref and an inverting input connected to the common node of the first switch K1 and the second switch K2 through the feedback network 302. In some embodiments, the feedback network 302 functions as a voltage divider to scale down the voltage across the capacitor CN to a level suitable for the amplifier 306.

The control logic unit 304 has an input connected to the output of the amplifier 306, a first output configured to control the first switch K1 and a second output configured to control the second switch K2.

In operation, the voltage across the capacitor CN is fed into the inverting input of the amplifier 306 through the feedback network 302. When the voltage fed into the inverting input of the amplifier 306 is greater than Vref, the amplifier 306 generates a logic low signal. The control logic unit 304 converts this logic low signal into gate drive signals to turn on K2 and turn off K1. In response to the turn-on of K2, the second current source IN provides a sink current to discharge the capacitor CN. As a result, the voltage across the capacitor CN is lowered down to a level determined by Vref. On the other hand, when the voltage fed into the inverting input of the amplifier 306 is less than Vref, the amplifier 306 generates a logic high signal. The control logic unit 304 converts this logic high signal into gate drive signals to turn on K1 and turn off K2. In response to the turn-on of K1, the first current source IP provides a source current to charge the capacitor CN. As a result, the voltage across the capacitor CN is increased to a level determined by Vref. Furthermore, when the voltage fed into the inverting input of the amplifier 306 is approximately equal to Vref, the control logic unit 304 is able to hold both switches K1 and K2 off. In other words, no current flows between the capacitor CN and the sink and source LDO 206.

It should be noted that the sink and source LDO 206 shown in FIG. 3 is merely an example and is not meant to limit the current embodiments. Other suitable sink and source power supplies may alternatively be used.

Figure 4:
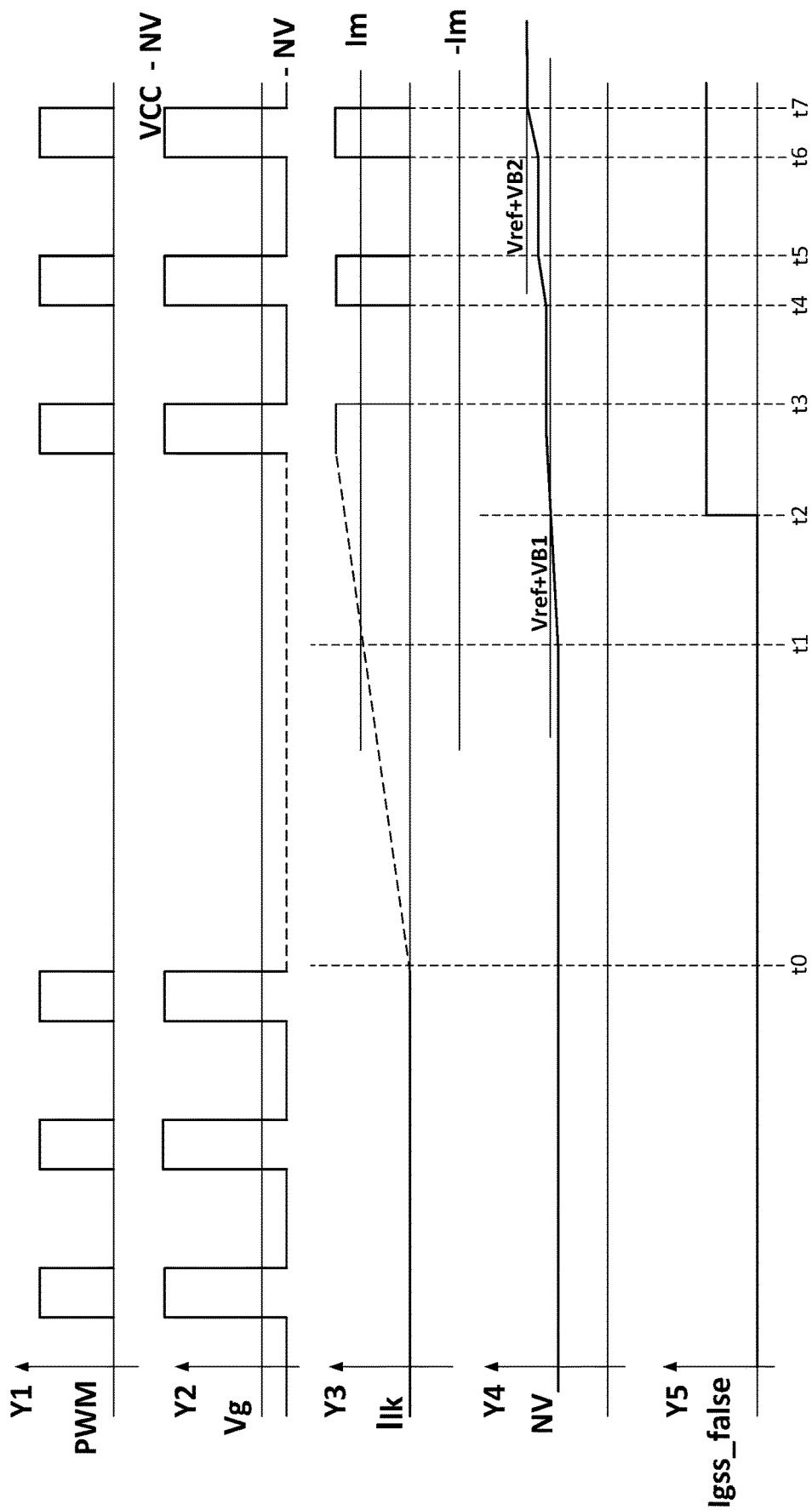
FIG. 4 illustrates various waveforms associated with the gate aging monitor apparatus in accordance with various embodiments of the present disclosure.

FIG. 4 illustrates various waveforms associated with the gate aging monitor apparatus in accordance with various embodiments of the present disclosure. The horizontal axis of FIG. 4 represents intervals of time. There may be five vertical axes. The first vertical axis Y1 represents the PWM signal fed into the gate driver 208 shown in FIG. 2. The second vertical axis Y2 represents the gate-to-source voltage (e.g., Vg shown in FIG. 2) of Q1. The third vertical axis Y3 represents the leakage current Ilk flowing from the gate to the source of Q1. The fourth vertical axis Y4 represents the voltage on the terminal NV (voltage across the capacitor CN). The fifth vertical axis Y5 represents the warning signal Igss_false generated by the comparator 212.

Referring back to FIG. 2, the PWM signal is applied to the gate of Q1 through the gate driver 208. When the PWM signal is of a logic low state, the gate of Q1 is connected to a ground voltage potential. The source of Q1 is connected to the positive terminal of the capacitor CN. As a result, the gate-to-source voltage (Vg) of Q1 is of a negative voltage (−NV) as shown in FIG. 4. When the PWM signal is of a logic high state, the gate driver generates a high voltage (e.g., VCC shown in FIG. 4). The gate-to-source voltage (Vg) of Q1 is equal to the difference (VCC-NV) between the high voltage generated by the gate driver 208 and the voltage across the capacitor CN.

Prior to t0, the gate leakage current is approximately equal to zero. From t0 to t1, the gate leakage current increases in a linear manner. Prior to t1, the gate leakage current is less than the current limit (Im) of the sink and source LDO 206. The sink and source LDO 206 is able to regulate the voltage across the capacitor CN. In some embodiments, the voltage across the capacitor CN is regulated at a voltage level equal to Vref as shown in FIG. 4.

At t1, the gate leakage current exceeds the current limit (Im) of the sink and source LDO 206. The sink and source LDO 206 cannot regulate the voltage across the capacitor CN. From t1 to t2, the gate leakage current charges the capacitor CN, thereby increasing the voltage on the NV terminal in a linear manner. At t2, the voltage on the NV terminal reaches a voltage level equal to the sum of Vref and VB1 (Vref+VB1). Referring back to FIG. 2, once the voltage on NV reaches the sum of Vref and VB1, the comparator 212 is triggered to generate the warning signal Igss_false at t2.

From t2 to t3, the leakage current keeps charging the capacitor CN. The voltage across CN ramps up. At t3, the PWM signal starts to have a logic low state. From t3 to t4, since the PWM signal has a logic low state, the leakage current does not occur. The voltage across the capacitor CN stays constant as shown in FIG. 4.

At t4, the PWM signal starts to have a logic high state. From t4 to t5, since the PWM signal has a logic high state, the gate leakage current occurs in response to the voltage applied to the gate of Q1. The voltage across the capacitor CN ramps up as shown in FIG. 4.

At t5, the PWM signal starts to have a logic low state. From t5 to t6, since the PWM signal has a logic low state, the gate leakage current does not occur. The voltage across the capacitor CN stays constant as shown in FIG. 4.

At t6, the PWM signal starts to have a logic high state. From t6 to t7, since the PWM signal has a logic high state, the gate leakage current occurs in response to the voltage applied to the gate of Q1. The voltage across the capacitor CN ramps up as shown in FIG. 4.

At t7, the voltage on the terminal NV reaches a voltage level equal to the sum of Vref and VB2 (Vref+VB2). Referring back to FIG. 2, once the voltage on the terminal NV reaches the sum of Vref and VB2, the voltage clamping circuit 204 is triggered. The Zener diode in the voltage clamping circuit 204 is configured to clamp the voltage across the capacitor CN to a voltage level equal to the sum of Vref and VB2.

Figure 5:
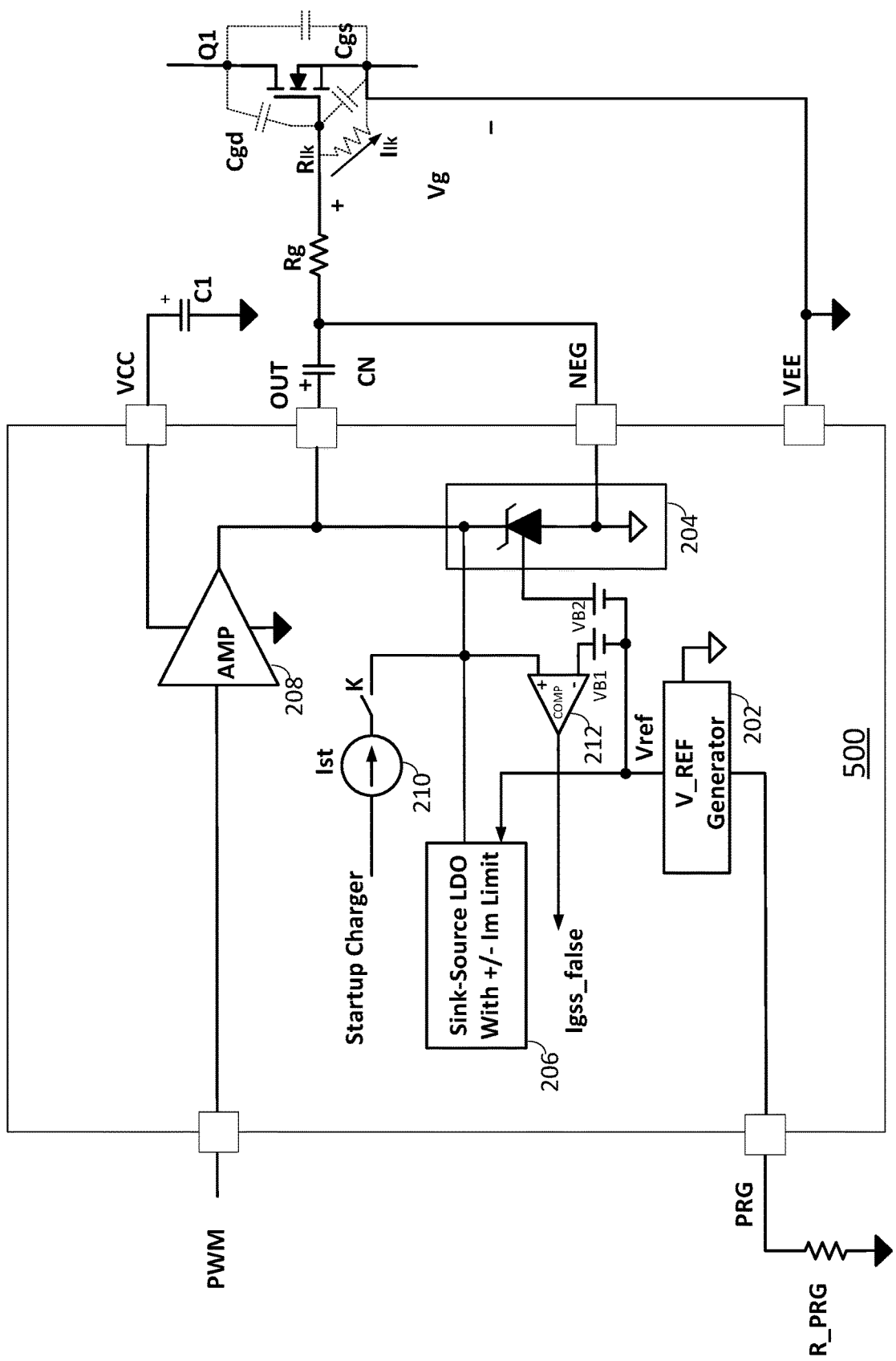
FIG. 5 illustrates a schematic diagram of a second implementation of the gate aging monitor apparatus shown in FIG. 1 in accordance with various embodiments of the present disclosure.

FIG. 5 illustrates a schematic diagram of a second implementation of the gate aging monitor apparatus shown in FIG. 1 in accordance with various embodiments of the present disclosure. The second implementation of the gate aging monitor apparatus shown in FIG. 5 is similar to the first implementation shown in FIG. 2 except that the capacitor CN is coupled between the output of the gate driver 208 and the gate of the power switch Q1. In response to this configuration change, the output of the sink and source LDO 206 is connected to a common node of the capacitor CN and the output of the gate driver 208. The operating principle of the second implementation of the gate aging monitor apparatus is similar to that of the first implementation of the gate aging monitor apparatus described above with respect to FIGS. 2-4, and hence is not discussed again to avoid repetition.

Figure 6:
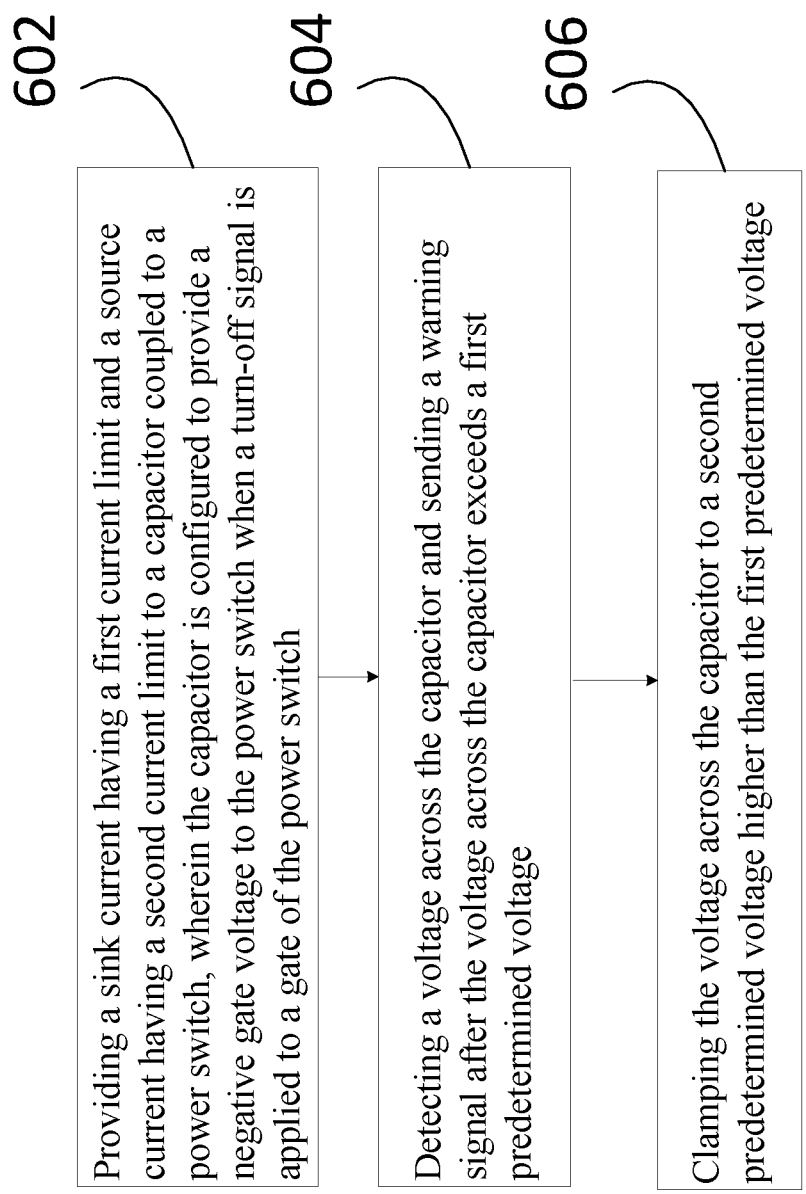
FIG. 6 illustrates a flow chart of operating the gate aging monitor apparatus shown in FIG. 1 in accordance with various embodiments of the present disclosure.

FIG. 6 illustrates a flow chart of operating the gate aging monitor apparatus shown in FIG. 1 in accordance with various embodiments of the present disclosure. This flowchart shown in FIG. 6 is merely an example, which should not unduly limit the scope of the claims. One of ordinary skill in the art would recognize many variations, alternatives, and modifications. For example, various steps illustrated in FIG. 6 may be added, removed, replaced, rearranged and repeated.

Referring back to FIG. 2, a negative bias capacitor CN is connected between a source of a power switch Q1 and a ground terminal. The negative bias capacitor CN is configured to provide a negative gate voltage to the power switch Q1. A sink and source LDO 206 is employed to regulate the voltage across the capacitor CN. When the voltage across the capacitor CN is less than a predetermine reference (e.g., Vref shown in FIG. 2), the sink and source LDO 206 is configured to provide a source current to charge the capacitor CN. On the other hand, when the voltage across the capacitor CN is greater than the predetermine reference, the sink and source LDO 206 is configured to provide a sink current to discharge the capacitor CN. In addition, the sink and source LDO 206 has a sink current limit. When the gate leakage current of the power switch Q1 is greater than the sink current limit of the sink and source LDO 206, the sink and source LDO 206 cannot regulate the voltage across the capacitor CN. The voltage across the capacitor CN is charged up by the gate leakage current. The excessive voltage across the capacitor CN can be used to determine whether a large gate leakage current occurs.

At step 602, a sink current having a first current limit and a source current having a second current limit are provided to a capacitor coupled to a power switch. The capacitor is a negative bias capacitor. The capacitor is configured to provide a negative gate voltage to the power switch when a turn-off signal is applied to the gate of the power switch.

At step 604, a voltage across the capacitor is detected by a comparator. A warning signal is generated by the comparator after the voltage across the capacitor exceeds a first predetermined voltage (e.g., (Vref+VB1) shown in FIG. 2).

At step 606, the voltage across the capacitor is clamped to a second predetermined voltage higher than the first predetermined voltage. In particular, the voltage across the capacitor is clamped by a Zener diode.

The method further comprises generating a reference voltage. Based on the reference voltage, the method further comprises regulating the voltage across the capacitor through providing the sink current having the first current limit and the source current having the second current limit to the capacitor.

The method further comprises configuring a sink and source power supply to provide the sink current having the first current limit and the source current having the second current limit to the capacitor The sink and source power supply comprises a first current source, a first switch, a second switch and a second current source connected in series between a bias voltage and ground, and wherein a common node of the first switch and the second switch is connected to the capacitor, an amplifier having a non-inverting input configured to receive a predetermined reference and an inverting input connected to the common node of the first switch and the second switch through a feedback network, and a control logic unit having an input connected to an output of the amplifier, a first output configured to control the first switch and a second output configured to control the second switch.

The power switch is connected to a ground terminal through the capacitor. An output of the sink and source power supply is connected to a common node of the capacitor and the source of the power switch.

The method further comprises configuring the amplifier and the control logic unit such that when a voltage fed into the inverting input of the amplifier is greater than the predetermined reference, the amplifier and the control logic unit generate gate drive signals to turn on the second switch and turn off the first switch, when the voltage fed into the inverting input of the amplifier is less than the predetermined reference, the amplifier and the control logic unit generate the gate drive signals to turn on the first switch and turn off the second switch, and when the voltage fed into the inverting input of the amplifier is approximately equal to the predetermined reference, the control logic unit is able to hold both first switch and the second switch off.

The method further comprises configuring a Zener diode to clamp the voltage across the capacitor to the second predetermined voltage, wherein the Zener diode is connected in parallel with the capacitor.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a capacitor coupled to a power switch, wherein the capacitor is configured to provide a negative gate voltage to the power switch when a turn-off signal is applied to a gate of the power switch; and
a sink and source power supply coupled to the capacitor, wherein the sink and source power supply has a first current limit for controlling a sink current flowing from the capacitor to the sink and source power supply, and a second current limit for controlling a source current flowing from the sink and source power supply to the capacitor.

2. The apparatus of claim 1, wherein:
the power switch is a metal-oxide-semiconductor field-effect transistor (MOSFET); and
the capacitor is a negative bias capacitor.

3. The apparatus of claim 1, wherein:
the sink and source power supply is a low dropout (LDO) regulator.

4. The apparatus of claim 3, wherein the sink and source power supply comprises:
a first current source, a first switch, a second switch and a second current source connected in series between a bias voltage and ground, and wherein a common node of the first switch and the second switch is connected to the capacitor;
an amplifier having a non-inverting input configured to receive a predetermined reference and an inverting input connected to the common node of the first switch and the second switch through a feedback network; and
a control logic unit having an input connected to an output of the amplifier, a first output configured to control the first switch and a second output configured to control the second switch.

5. The apparatus of claim 4, wherein:
the first current source is of the second current limit for controlling the source current; and
the second current source is of the first current limit for controlling the sink current.

6. The apparatus of claim 1, further comprising:
a comparator having an inverting input configured to receive a first reference, a non-inverting input connected to a common node of the capacitor and the power switch, and an output configured to generate a warning signal.

7. The apparatus of claim 1, further comprising:
a Zener diode connected in parallel with the capacitor, wherein the Zener diode is configured such that a voltage across the capacitor is clamped at a voltage level equal to a second reference.

8. The apparatus of claim 1, wherein:
the capacitor is connected between a source of the power switch and a ground terminal; and
an output of the sink and source power supply is connected to a common node of the capacitor and the source of the power switch.

9. The apparatus of claim 1, wherein:
the capacitor is coupled between an output of a gate driver and the gate of the power switch; and
an output of the sink and source power supply is connected to a common node of the capacitor and the output of the gate driver.

10. A method comprising:
providing a sink current having a first current limit and a source current having a second current limit to a capacitor coupled to a power switch, wherein the capacitor is configured to provide a negative gate voltage to the power switch when a turn-off signal is applied to a gate of the power switch;
detecting a voltage across the capacitor and sending a warning signal after the voltage across the capacitor exceeds a first predetermined voltage; and
clamping the voltage across the capacitor to a second predetermined voltage higher than the first predetermined voltage.

11. The method of claim 10, further comprising:
generating a reference voltage; and
based on the reference voltage, regulating the voltage across the capacitor through providing the sink current having the first current limit and the source current having the second current limit to the capacitor.

12. The method of claim 10, further comprising:
configuring a sink and source power supply to provide the sink current having the first current limit and the source current having the second current limit to the capacitor, wherein the sink and source power supply comprises:
a first current source, a first switch, a second switch and a second current source connected in series between a bias voltage and ground, and wherein a common node of the first switch and the second switch is connected to the capacitor;
an amplifier having a non-inverting input configured to receive a predetermined reference and an inverting input connected to the common node of the first switch and the second switch through a feedback network; and
a control logic unit having an input connected to an output of the amplifier, a first output configured to control the first switch and a second output configured to control the second switch.

13. The method of claim 12, wherein:
the power switch is connected to a ground terminal through the capacitor; and
an output of the sink and source power supply is connected to a common node of the capacitor and the source of the power switch.

14. The method of claim 12, further comprising:
configuring the amplifier and the control logic unit such that:
when a voltage fed into the inverting input of the amplifier is greater than the predetermined reference, the amplifier and the control logic unit generate gate drive signals to turn on the second switch and turn off the first switch;
when the voltage fed into the inverting input of the amplifier is less than the predetermined reference, the amplifier and the control logic unit generate the gate drive signals to turn on the first switch and turn off the second switch; and when the voltage fed into the inverting input of the amplifier is approximately equal to the predetermined reference, the control logic unit is able to hold both first switch and the second switch off.

15. The method of claim 10, further comprising:

configuring a Zener diode to clamp the voltage across the capacitor to the second predetermined voltage, wherein the Zener diode is connected in parallel with the capacitor.

16. A system comprising:

a capacitor coupled to a power switch; and a semiconductor chip comprising a sink and source power supply, a gate leakage detection circuit and a voltage clamping circuit, wherein:

the sink and source power supply has a first current limit for controlling a sink current flowing from the capacitor to the sink and source power supply, and a second current limit for controlling a source current flowing from the sink and source power supply to the capacitor; and the gate leakage detection circuit comprises a comparator having an inverting input configured to receive a first reference, a non-inverting input connected to a common node of the capacitor and the power switch, and an output configured to generate a warning signal.

17. The system of claim 16, wherein:

the power switch is connected to a ground terminal through the capacitor; and an output of the sink and source power supply is connected to a common node of the capacitor and the source of the power switch.

18. The system of claim 16, further comprising:

a gate driver having an input configured to receive a gate drive signal, and an output connected to a gate of the power switch through the capacitor.

19. The system of claim 16, wherein the sink and source power supply comprises:

a first current source, a first switch, a second switch and a second current source connected in series between a bias voltage and ground, and wherein a common node of the first switch and the second switch is connected to the capacitor;

an amplifier having a non-inverting input configured to receive a predetermined reference and an inverting input connected to the common node of the first switch and the second switch through a feedback network; and a control logic unit having an input connected to an output of the amplifier, a first output configured to control the first switch and a second output configured to control the second switch.

20. The system of claim 16, wherein:

the voltage clamping circuit is a Zener diode connected in parallel with the capacitor, wherein the Zener diode is configured such that a voltage across the capacitor is clamped at a voltage level equal to a predetermined voltage.

* * * * *